(12) United States Patent
Park et al.

(10) Patent No.: US 10,314,192 B2
(45) Date of Patent: Jun. 4, 2019

(54) DISPLAY APPARATUS

(71) Applicant: SAMSUNG ELECTRONICS CO., LTD., Suwon-si (KR)

(72) Inventors: Ji-Won Park, Suwon-si (KR); Kyoung Youn Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/441,828

(22) Filed: Feb. 24, 2017

(65) Prior Publication Data
US 2017/0265321 A1 Sep. 14, 2017

(30) Foreign Application Priority Data

Mar. 11, 2016 (KR) .................. 10-2016-0029300

(51) Int. Cl.
| | | |
|---|---|---|
| H05K 7/00 | (2006.01) | |
| H05K 7/14 | (2006.01) | |
| F16M 11/22 | (2006.01) | |
| H05K 5/00 | (2006.01) | |
| H05K 5/02 | (2006.01) | |
| F16M 11/04 | (2006.01) | |
| G06F 1/16 | (2006.01) | |
| G09F 7/18 | (2006.01) | |

(52) U.S. Cl.
CPC ......... *H05K 7/1417* (2013.01); *F16M 11/041* (2013.01); *F16M 11/22* (2013.01); *G06F 1/1601* (2013.01); *H05K 5/0017* (2013.01); *H05K 5/0234* (2013.01); *F16M 2200/08* (2013.01); *G09F 7/18* (2013.01)

(58) Field of Classification Search
CPC .. H05K 7/1417; H05K 5/0017; H05K 5/0234; F16M 11/041; F16M 11/22; F16M 2200/08; G06F 1/1601; G09F 7/18
USPC .................... 248/127, 519, 188.7
See application file for complete search history.

(56) References Cited

U.S. PATENT DOCUMENTS

| | | | | |
|---|---|---|---|---|
| 3,021,960 A | * | 2/1962 | Pipe | A47B 13/023 |
| | | | | 211/205 |
| 3,513,986 A | * | 5/1970 | Schier | A47F 5/04 |
| | | | | 211/1 |
| 3,637,179 A | * | 1/1972 | Marschak | A47B 91/00 |
| | | | | 211/205 |
| 4,010,922 A | * | 3/1977 | Heller | A47C 4/02 |
| | | | | 248/165 |
| 4,520,981 A | * | 6/1985 | Harrigan | F16M 11/046 |
| | | | | 248/161 |

(Continued)

FOREIGN PATENT DOCUMENTS

| | | |
|---|---|---|
| EP | 2719937 A1 | 4/2014 |
| KR | 10-2007-0101477 A | 10/2007 |

OTHER PUBLICATIONS

Communication dated Aug. 16, 2017, issued by the European Patent Office in counterpart European Application No. 17159941.8.

(Continued)

*Primary Examiner* — Anita M King
(74) *Attorney, Agent, or Firm* — Sughrue Mion, PLLC

(57) ABSTRACT

A display apparatus includes a display unit, and a stand configured to support the display unit to stand on a horizontal plane, wherein the stand includes a first stand member and a second stand member coupled with each other in a front-rear direction.

15 Claims, 9 Drawing Sheets

(56) References Cited

U.S. PATENT DOCUMENTS

| | | | | |
|---|---|---|---|---|
| 5,082,222 | A * | 1/1992 | Hsu | F16M 11/242 |
| | | | | 248/170 |
| 7,669,814 | B2 * | 3/2010 | Bogel | F16M 11/16 |
| | | | | 248/163.1 |
| 8,215,603 | B2 * | 7/2012 | Puleo | A47G 33/12 |
| | | | | 248/519 |
| 2005/0139745 | A1 | 6/2005 | Liao et al. | |
| 2005/0210794 | A1 | 9/2005 | Hsu | |
| 2006/0133016 | A1 * | 6/2006 | North | F16M 11/10 |
| | | | | 361/679.22 |
| 2007/0075195 | A1 | 4/2007 | Chen et al. | |
| 2008/0023598 | A1 | 1/2008 | Tsuo et al. | |
| 2014/0104763 | A1 * | 4/2014 | Lee | F16M 11/00 |
| | | | | 361/679.01 |

OTHER PUBLICATIONS

Communication dated Jul. 19, 2018, issued by the European Patent Office in counterpart European Application No. 17159941.8.

* cited by examiner

DISPLAY APPARATUS

CROSS-REFERENCE TO RELATED APPLICATION

This application claims priority from Korean Patent Application No. 10-2016-0029300, filed on Mar. 11, 2016 in the Korean Intellectual Property Office, the disclosure of which is incorporated herein by reference in its entirety.

BACKGROUND

1. Field

Apparatuses consistent with exemplary embodiments relate to a display apparatus having a stand to support a display unit to stand on a horizontal plane.

2. Description of the Related Art

In general, a display apparatus is an apparatus for displaying images, and examples of the display apparatus include a monitor, a television, etc.

The display apparatus includes a display unit to display a screen, and a stand to support the display unit to stand on a horizontal plane.

The stand has a sufficiently wide width in a front-rear direction, as well as in a left-right direction, in order to prevent the display unit from traveling.

Generally, a width in the left-right direction of the stand is smaller than that in the left-right direction of the display unit, but a width in the front-rear direction of the stand needs to be inevitably wide compared to that in the front-rear direction of the display unit. Accordingly, the width in the front-rear direction of a packing box for packing the display unit also needs to be wide in correspondence to that in the front-rear direction of the stand.

SUMMARY

One or more exemplary embodiments provide a display apparatus having a stand capable of reducing the size of a packing box.

Also, one or more exemplary embodiments provide a display apparatus capable of easily coupling a stand with a display unit.

In accordance with an aspect of an exemplary embodiment, there is provided a display apparatus including a display unit, and a stand configured to support the display unit to stand on the horizontal plane, wherein the stand includes a first stand member and a second stand member coupled with each other in the front-rear direction to form the stand.

The stand may include a coupling portion extending upward and coupled with the display unit, and the display unit may include a coupling groove coupled with the coupling portion.

The first stand member may include a first leg portion supported on the horizontal plane, and a first coupling portion forming a front portion of the coupling portion, and the second stand member may include a second leg portion supported on the horizontal plane, and a second coupling portion forming a rear portion of the coupling portion.

The first coupling portion may include a first coupling bracket installed in a rear center portion of the first leg portion, and the second coupling portion may include a second coupling bracket installed in a front center portion of the second leg portion.

The display apparatus may further include a locking member disposed in one of the first coupling bracket and the second coupling bracket, and a locking hole formed in the other one of the first coupling bracket and the second coupling bracket, wherein the locking member passes through and is locked within the locking hole.

The locking member may include a shaft portion protruding in the shape of a cylinder, and at least one locking protrusion protruding in a radial direction from a top end of the shaft portion, and the locking hole may include a shaft through hole to pass the shaft portion through, and at least one protrusion through hole extending in a radial direction from the shaft through hole, and spaced in a circumferential direction apart from the locking protrusion with the locking member locked within the locking hole.

The display apparatus may further include a stopper protrusion protruding from one of the first coupling bracket and the second coupling bracket, and a stopper groove formed in the other one of the first coupling bracket and the second coupling bracket, and configured to support the stopper protrusion.

The first coupling bracket and the second coupling bracket may be disposed to correspond to each other, and include at least one first coupling hole and at least one second coupling hole, respectively, which are coupled with a fastening member.

The display apparatus may include at least one support protrusion protruding from one of the first coupling bracket and the second coupling bracket, wherein at least one support hole is formed in the other one of the first coupling bracket and the second coupling bracket so that the at least one support protrusion is inserted into and supported by the at least one support hole.

The first leg portion may extend toward both directions with a predetermined angle with respect to a front direction to form a V-shape, and the second leg portion may extend toward both directions with a predetermined angle with respect to a rear direction to form a V-shape.

The locking member may be fixed at a hole formed in one of the first coupling bracket and the second coupling bracket.

In accordance with an aspect of another exemplary embodiment, there is provided a display apparatus including a display unit, and a stand configured to support the display unit to stand on the horizontal plane, wherein the stand includes a first stand member and a second stand member coupled with each other in the front-rear direction to form the stand, a locking member disposed in one of the first stand member and the second stand member, and a locking hole formed in the other one of the first stand member and the second stand member, wherein the locking member passes through and is locked within the locking hole.

The locking member may include a shaft portion protruding in the shape of a cylinder, and at least one locking protrusion protruding in a radial direction from a top end of the shaft portion. The locking hole may include a shaft through hole to pass the shaft portion through, and at least one protrusion through hole extending in a radial direction from the shaft through hole, and spaced in a circumferential direction apart from the at least one locking protrusion with the locking member locked within the locking hole.

The display apparatus may include a stopper protrusion protruding from one of the first stand member and the second stand member, and a stopper groove formed in the other one of the first stand member and the second stand member, and configured to support the stopper protrusion.

BRIEF DESCRIPTION OF THE DRAWINGS

The above and/or other aspects will become apparent and more readily appreciated from the following description of exemplary embodiments, taken in conjunction with the accompanying drawings of which.

DETAILED DESCRIPTION

Figure 1:
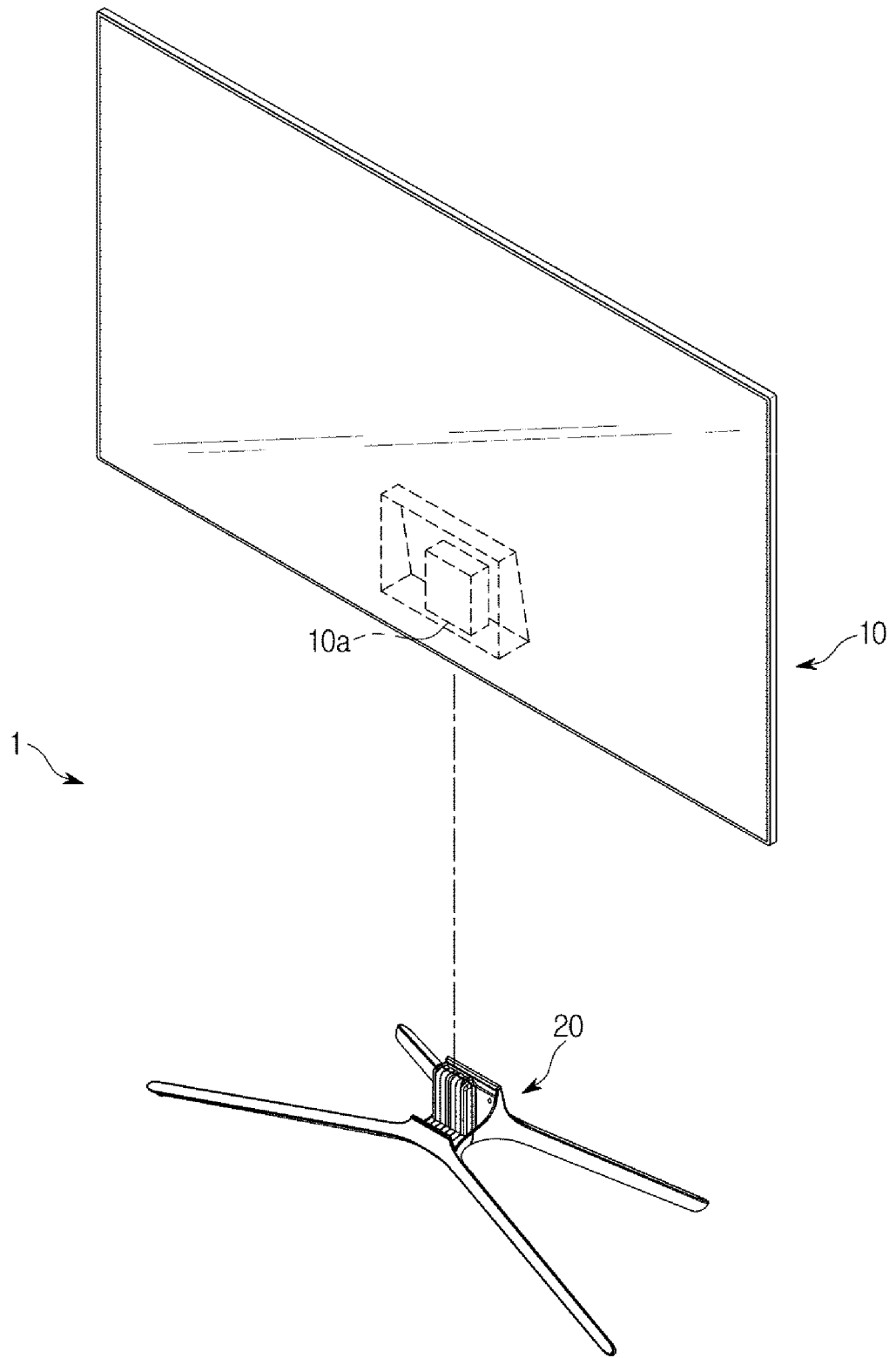
FIG. 1 is an exploded perspective view showing a coupling of a display unit and a stand according to an exemplary embodiment.

Configurations illustrated in the embodiments and the drawings described in the present specification are only exemplary, and thus it is to be understood that various modified examples, which may replace the exemplary embodiments and the drawings described in the present specification, are possible when filing the present application.

Also, like reference numerals or symbols provided in the drawings of the present specification indicate elements or components that perform substantially similar functions.

Also, the terms used in the present specification are for describing embodiments and not for limiting or restricting the present disclosure. It is to be understood that the singular articles "a," "an," and "the" include plural referents unless the context clearly dictates otherwise. It will be understood that the terms "includes," "comprises," "including," and/or "comprising," when used in this specification, specify the presence of stated features, figures, steps, components, or combinations thereof, but do not preclude the presence or addition of one or more other features, figures, steps, components, members, or combinations thereof.

It will be understood that, although the ordinal terms first, second, etc. may be used herein to describe various components, such components should not be limited by these terms. These terms are only used to distinguish one component from another. For example, a first component could be termed a second component, and, similarly, a second component could be termed a first component, without departing from the scope of the present disclosure. As used herein, the term "and/or" includes any and all combinations of one or more associated listed items.

Hereinafter, a display apparatus according to an exemplary embodiment will be described in detail with reference to the appended drawings.

As shown in FIG. 1, a display apparatus 1 according to an exemplary embodiment may include a display unit 10 configured to display a screen, and a stand 20 configured to support the display unit 10 to stand on a horizontal plane.

Figure 2:
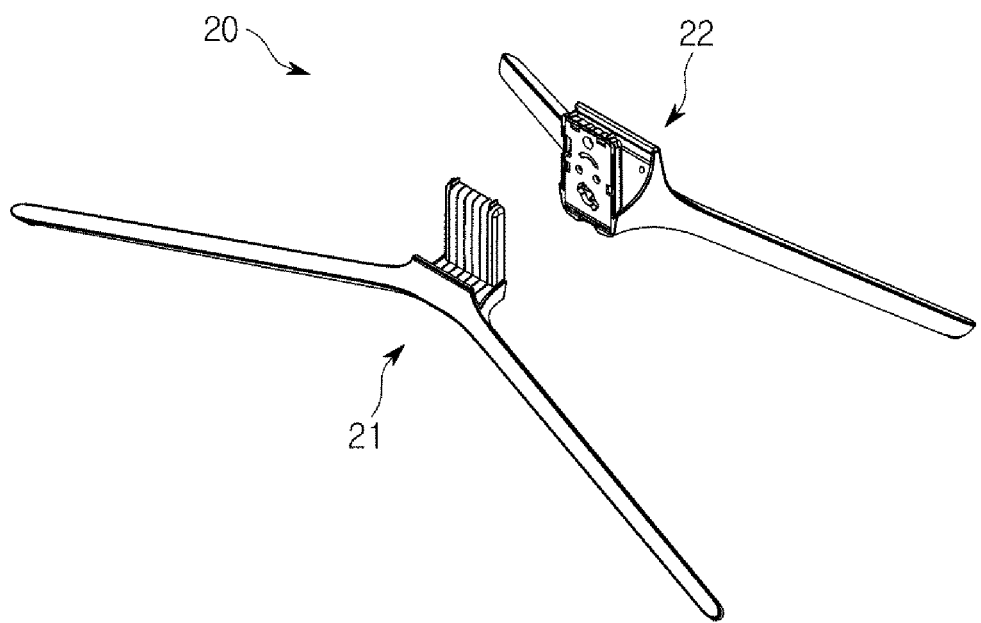
FIGS. 2 and 3 are exploded perspective views showing the stand according to an exemplary embodiment.
Figure 3:
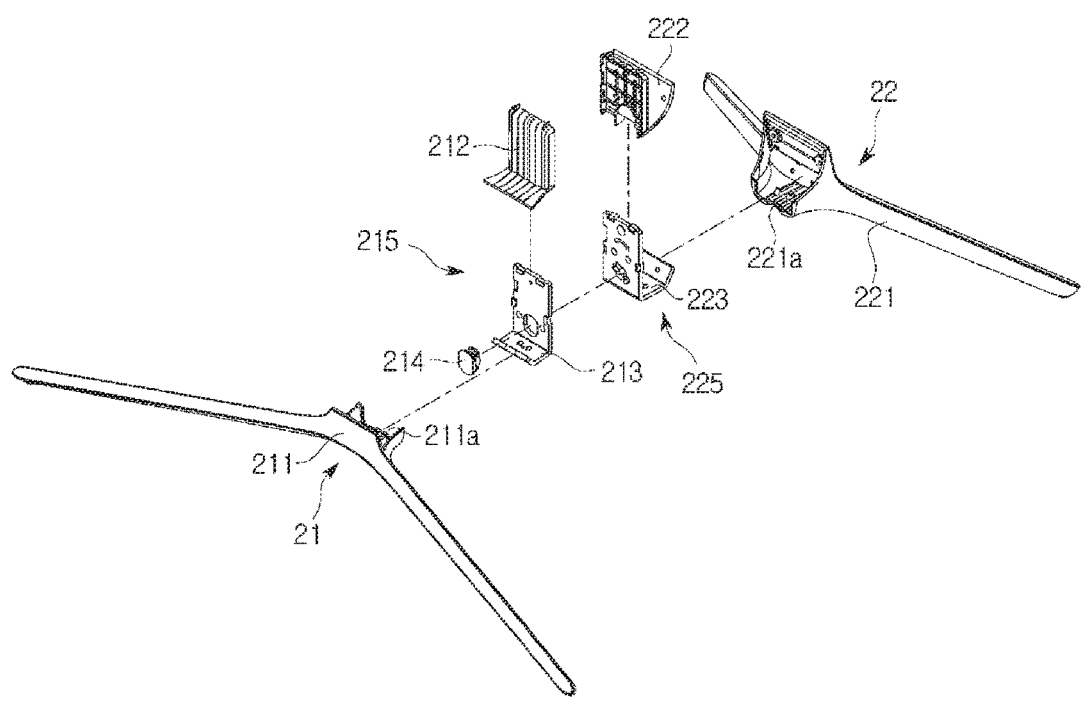
Figure 4:
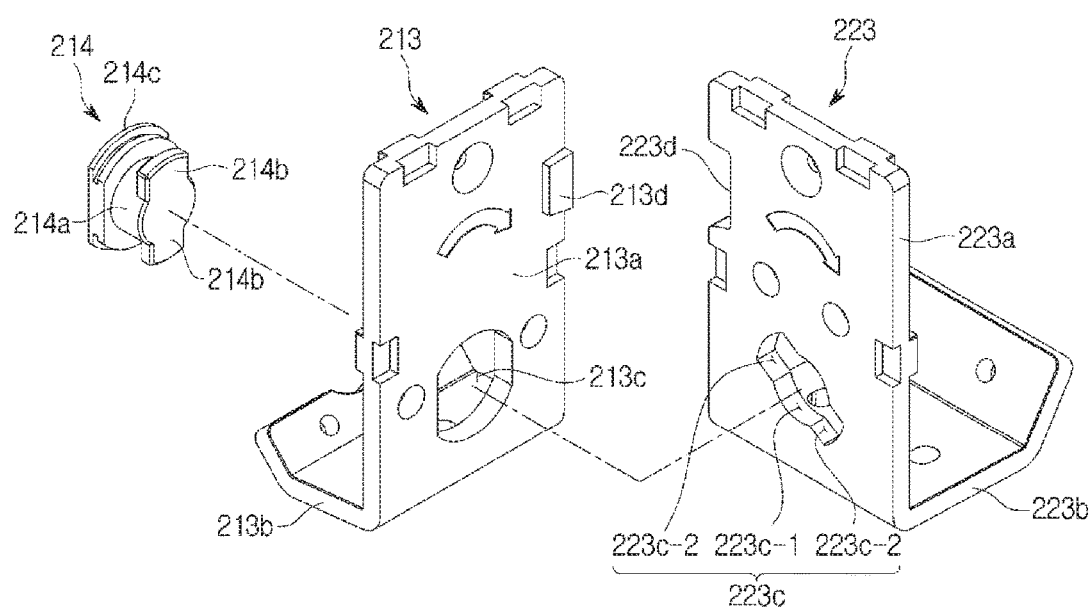
FIG. 4 is an exploded perspective view showing a first coupling bracket and a second coupling bracket according to an exemplary embodiment.

The stand 20 may include, as shown in FIGS. 2 and 3, leg portions 211 and 221 supported on the horizontal plane, and a coupling portion extending upward and coupled with the display unit 10. In the rear lower portion of the display unit 10, a coupling groove 10a may be formed which the coupling portion is inserted into and coupled with.

The stand 20 may include a first stand member 21 forming a part of a front portion of the stand 20, and a second stand member 22 forming a part of a rear portion of the stand 20 and coupled with the first stand member 21 to form the stand 20 together with the first stand member 21.

As such, since the stand 20 is configured with the first stand member 21 and the second stand member 22 that can be coupled with each other in a front-rear direction, it is possible to significantly reduce the width in a front-rear direction of a packing box for packing the display apparatus 1, and accordingly, it is possible to more efficiently deliver and keep the display apparatus 1.

The first stand member 21 may include the first leg portion 211 supported on the horizontal plane, and a first coupling portion 215 forming a part of a front portion of the coupling portion, and the second stand member 22 may include the second leg portion 221 supported on the horizontal plane, and a second coupling portion 225 forming a part of a rear portion of the coupling portion.

Accordingly, the display apparatus 1 may be completely assembled by coupling the first stand member 21 with the second stand member 22 through the first coupling portion 215 and the second coupling portion 225 to form the stand 20, and then inserting the coupling portion formed by the first coupling portion 215 and the second coupling portion 225 into the coupling groove 10a of the display unit 10.

The first leg portion 211 may extend toward both directions with a predetermined angle with respect to a front direction, and may be formed with a nearly V-shape and supported on the horizontal plane. The first coupling portion 215 may include a first coupling cover 212 forming an outer surface of the first coupling portion 215, and a first coupling bracket 213 fixed at a rear center portion of the first leg portion 211. In the present exemplary embodiment, the first coupling cover 212 may be formed of a resin, and the first coupling bracket 213 may be formed of metal so that the first coupling portion 215 can obtain sufficient strength by the first coupling bracket 213.

In the rear center portion of the first leg portion 211, a first fixing groove 211a may be concavely formed so that the first coupling bracket 213 may be fixed in the first fixing groove 211a, and the first coupling cover 212 may be disposed to cover top and front portions of the first coupling bracket 213.

The first coupling bracket 213 may be formed in the shape of a quadrangular plate, and may include a first bracket portion 213a disposed vertically and coupleable with the second coupling bracket 223, and a first fixing portion 213b extending in the front direction from the lower end of the first bracket portion 213a and fixable within the first fixing groove 211a.

The second leg portion 221 may extend toward both directions with a predetermined angle with respect to a rear direction, and may be formed with a nearly V-shape and supported on the horizontal plane. The second coupling portion 225 may include a second coupling cover 222 forming an outer surface of the second coupling portion 225, and a second coupling bracket 223 fixed at a front center portion of the second leg portion 221. In the present exemplary embodiment, the second coupling cover 222 may be formed of a resin, and the second coupling bracket 223 may be formed of metal so that the second coupling portion 225 can obtain sufficient strength by the second coupling bracket 223.

In the front center portion of the second leg portion 221, a second fixing groove 221a may be concavely formed so that the second coupling bracket 223 may be fixed in the second fixing groove 221a, and the second coupling cover 222 may be disposed to cover top and rear portions of the second coupling bracket 223.

The second coupling bracket 223 may be formed in the shape of a quadrangular plate, and may include a second bracket portion 223a disposed vertically and coupleable with the first coupling bracket 213, and a second fixing portion 223b extending in the rear direction from the lower end of the second bracket portion 223a and fixable within the second fixing groove 221a.

Also, in order to stably couple the first coupling bracket 213 with the second coupling bracket 223, a locking member 214 may be installed in the first bracket portion 213a of the first coupling bracket 213, and a locking hole 223c may be formed in the second bracket portion 223a of the second coupling bracket 223 so that the locking member 214 may pass through the locking hole 223c and may be locked within the locking hole 223c. In the present exemplary embodiment, the locking member 214 may be fabricated separately from the first coupling bracket 213, and then forcibly pressed into a hole 213c formed in the first bracket portion 213a of the first coupling bracket 213 and fixed therein.

The locking member 214 may include a shaft portion 214a protruding in the shape of a cylinder, two locking protrusions 214b protruding symmetrically to the outside in radial direction from the top end of the shaft portion 214a, and a base portion 214c that may be pressed and fixed in the hole 213c formed in the first coupling bracket 213, wherein the shaft portion 214a may protrude from one surface of the base portion 214c.

The locking hole 223c may include a shaft through hole 223c-1 formed in the shape of a circle to correspond to the shaft portion 214a, and protrusion through holes 223c-2 extending symmetrically in the radial direction from the shaft through hole 223c-1, wherein the locking protrusions 214b pass through the protrusion through holes 223c-2. In the state in which the first coupling bracket 213 is coupled with the second coupling bracket 223, the locking protrusions 214b may be spaced in a circumferential direction apart from the protrusion through holes 223c-2.

In the present exemplary embodiment, the locking protrusions 214b may be spaced at an angle of 55 degrees in the circumferential direction apart from each respective protrusion through hole 223c-2, which is aimed to minimize the areas of the locking protrusions 214b exposed through the protrusion through holes 223c-2 and not supported by a surface area around the through hole 223c in the state in which the first coupling bracket 213 is coupled with the second coupling bracket 223, while minimizing the relative rotation angles (that is, the relative rotation angles of the first stand member 21 and the second stand member 22) of the coupling brackets 213 and 223. That is, by maximizing the areas of the locking protrusions 214b supported by the surface area around the through hole 223c of the second coupling bracket 223, it is possible to more stably couple the first coupling bracket 213 with the second coupling bracket 223.

Also, in order to limit the rotation angle of the first coupling bracket 213 with respect to the second coupling bracket 223, a stopper protrusion 213d may be formed at one side end of the first coupling bracket 213, and at one side end of the second coupling bracket 223, a stopper groove 223d may be formed at a location corresponding to the stopper protrusion 213d.

Figure 5:
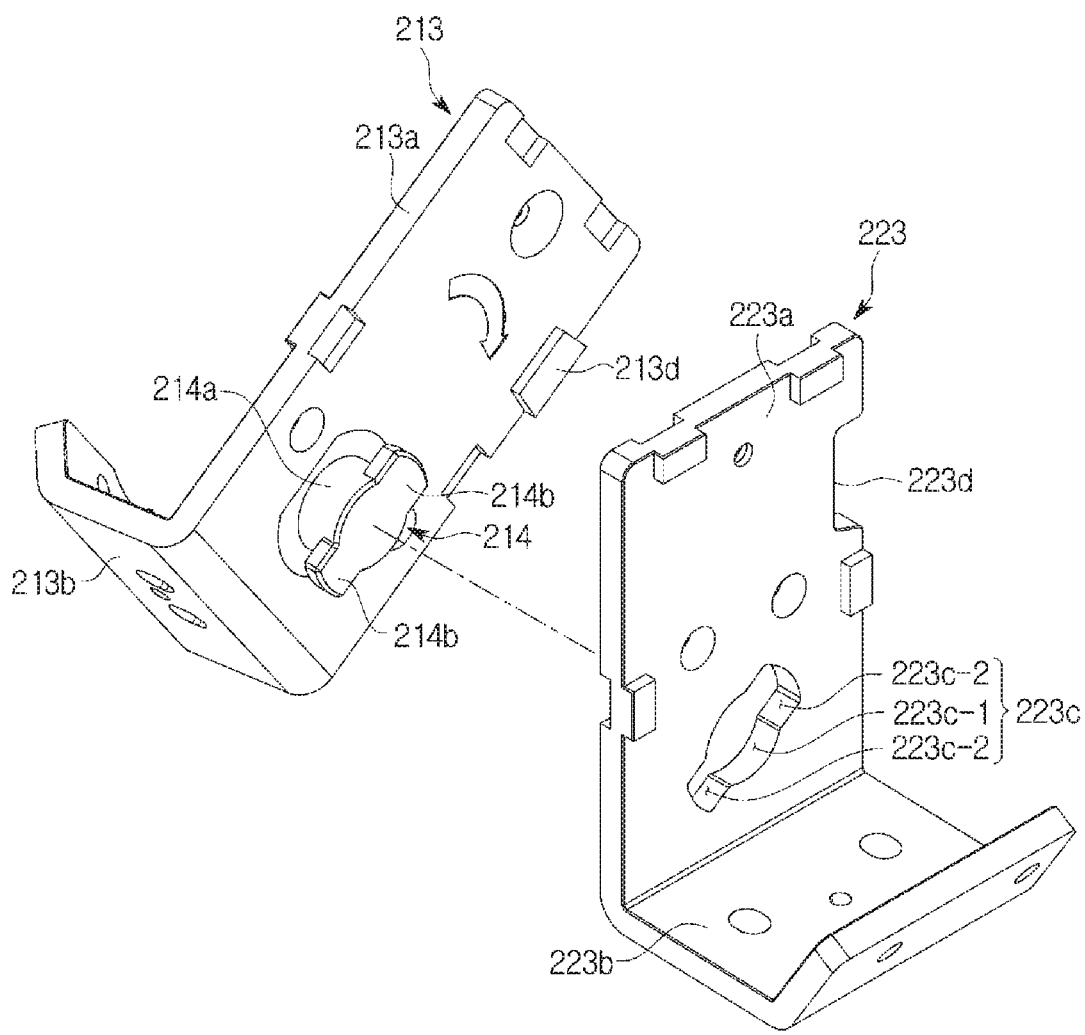
FIGS. 5, 6 and 7 are exploded perspective views showing a coupling of the first coupling bracket and the second coupling bracket according to an exemplary embodiment.
Figure 6:
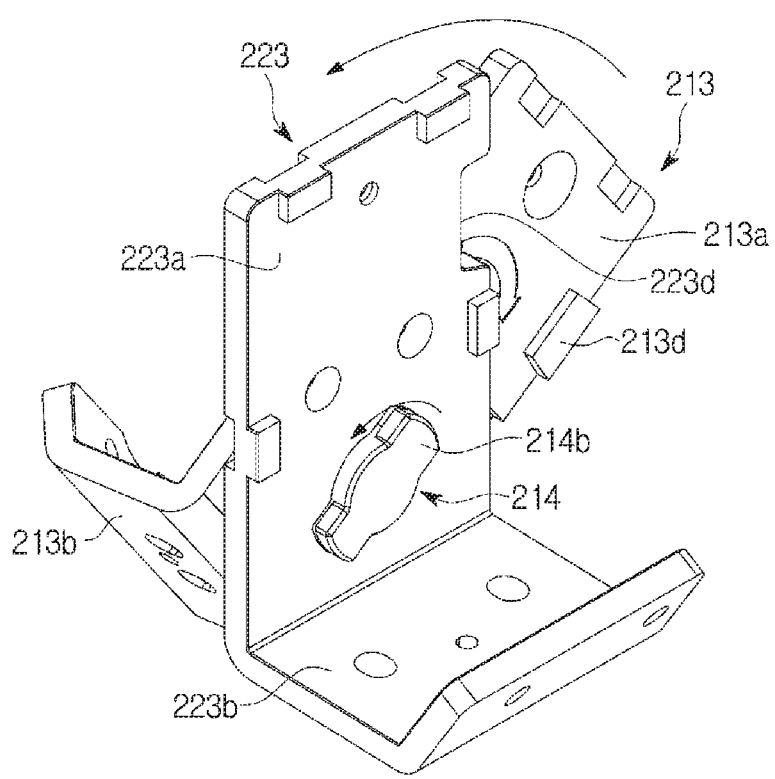

Accordingly, as shown in FIG. 5, if any one of the first coupling bracket 213 and the second coupling bracket 223 is rotated by an angle of 55 degrees in one direction, the locking protrusions 214b may be located to correspond to the protrusion through holes 223c-2. Accordingly, if the first coupling bracket 213 is rotated by the angle of 55 degrees in a first direction (e.g., a clockwise direction) with respect to the second coupling bracket 223 and then pressed toward the second coupling bracket 223, as shown in FIG. 6, the locking protrusions 214b may pass through the protrusion through holes 223c-2.

Figure 7:
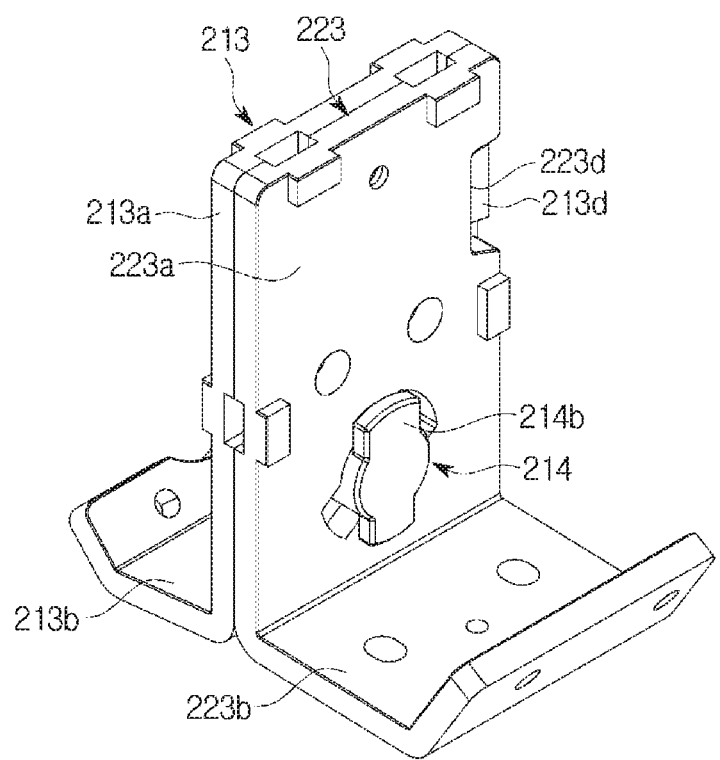

In this state, if the first coupling bracket 213 is rotated in a second direction (e.g., a counterclockwise direction), as shown in FIG. 7, the locking protrusions 214b may be spaced in the circumferential direction apart from each respective protrusion through hole 223c-2. In this state, the locking protrusions 214b cannot pass through the protrusion through holes 223c-2. At this time, since the stopper protrusion 213d is supported by the stopper groove 223d, the first coupling bracket 213 may be prevented from rotating more than the angle of 55 degrees in the second direction (e.g. the counterclockwise direction).

In this state, since the locking protrusions 214b are supported by the surface area around the shaft through hole 223c-1 of the second coupling bracket 223, the first coupling bracket 213 can be stably coupled with and fixed to the second coupling bracket 223.

As described above, since the first stand member 21 is coupled with the second stand member 22 by passing the shaft portion 214a and the locking protrusions 214b of the locking member 214 through the through hole 223c and then relatively rotating the first stand member 21 with respect to the second stand member 22, it is possible to easily couple the first stand member 21 with the second stand member 22, while significantly reducing time for coupling between the first stand member 21 and the second stand member 22.

Also, as described above, since the first stand member 21 can be stably coupled with and fixed to the second stand member 22 through the locking member 214 and the locking hole 223c, it is possible to omit or minimize various kinds of additional components and/or members such as coupling means for maintaining the coupled state of the first stand member 21 and the second stand member 22.

In the present exemplary embodiment, the locking member 214 may be fabricated separately from the first coupling bracket 213, and then fixed at the first coupling bracket 213. However, in other exemplary embodiments the locking member 214 and the first coupling bracket 213 may be integrated into one body (i.e., fabricated integrally).

In the present exemplary embodiment, the locking member 214 includes two locking protrusions 214b and the locking hole 223c includes two protrusion through holes 223c-2. However, in other exemplary embodiments the locking member 214 may include any appropriate number of locking protrusions 214b (e.g., one, two, three, four, etc.) and, similarly, the locking hole 223c may include any appropriate number of protrusion through holes 223c-2 (e.g., one, two, three, four, etc.).

Also, in the present exemplary embodiment, the locking member 214 is fixed (separately or integrally) to the first coupling bracket 213, and the locking hole 223c is formed in the second coupling bracket 223, however, in other exemplary embodiments the locking member 214 may be fixed (separately or integrally) to the second coupling bracket 223, and the locking hole 223c may be formed in the first coupling bracket 213.

Also, in the present exemplary embodiment, the stopper protrusion 213d is formed on the first coupling bracket 213, and the stopper groove 223d is formed in the second coupling bracket 223. However, in other exemplary embodiments the stopper protrusion 213d may be formed on the second coupling bracket 223, and the stopper groove 223d may be formed in the first coupling bracket 213.

Figure 9:
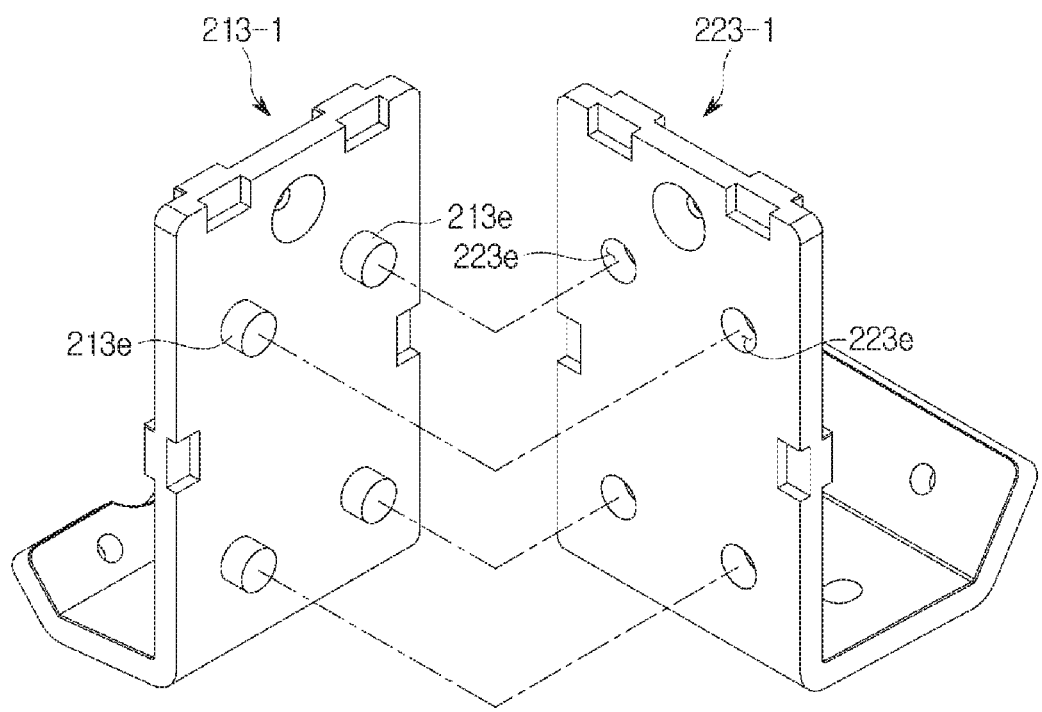
FIG. 9 is an exploded perspective view showing a first coupling bracket and a second coupling bracket according to another exemplary embodiment.

In the present exemplary embodiment, the first coupling bracket 213 is coupled with the second coupling bracket 223 through the locking member 214 and the locking hole 223c, however, as shown in FIG. 9, in other exemplary embodiments a plurality of support protrusions 213e may be formed in a first coupling bracket 213-1 in so as to protrude toward a second coupling bracket 223-1, a plurality of support holes 223e having shapes corresponding to the support protrusions 213e may be formed in the second coupling bracket 223-2 at locations corresponding to the support protrusions 213e, and the first coupling bracket 213-1 may be coupled with the second coupling bracket 223-1 through the support protrusions 213e and the support holes 223e. For example, among other coupling methods, the support protrusions 213e and the support holes 223e may be press fit (i.e., interference or friction fit) together.

Figure 8:
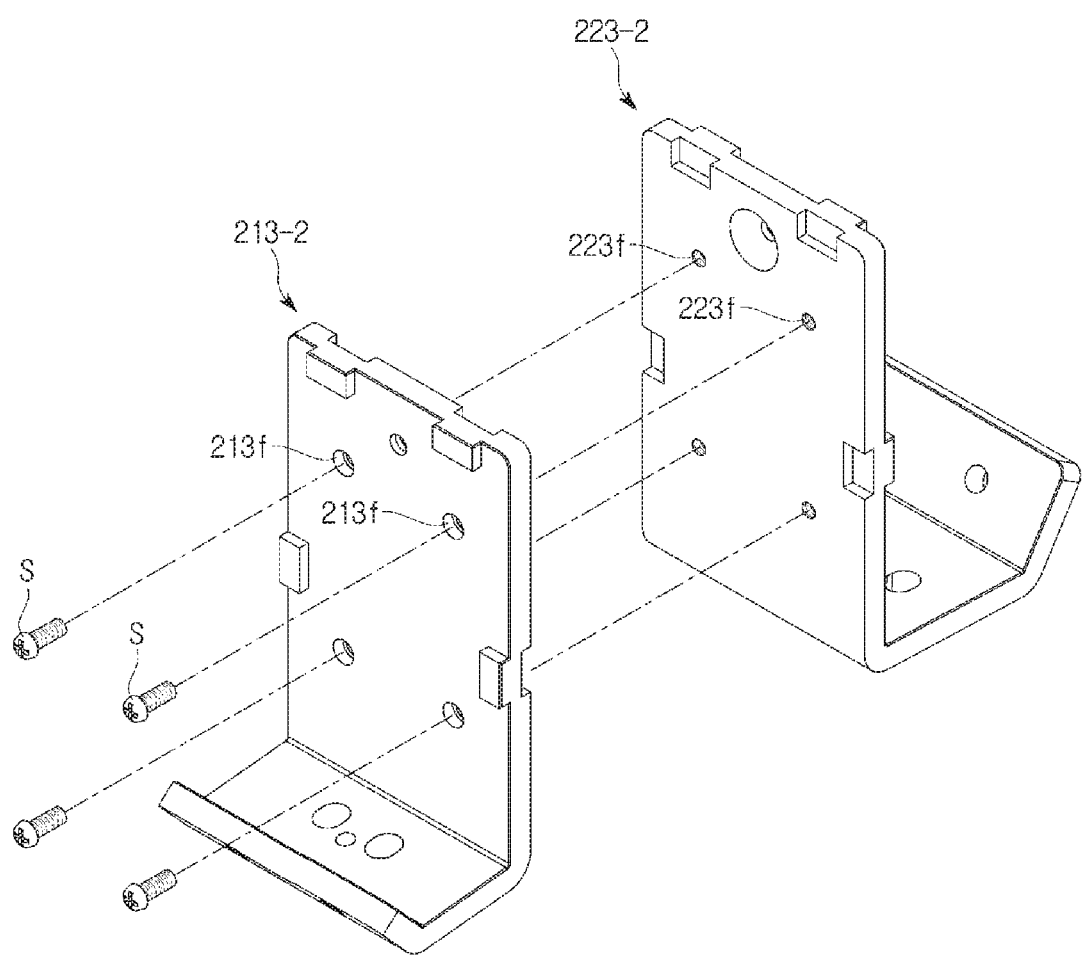
FIG. 8 is an exploded perspective view showing a first coupling bracket and a second coupling bracket according to another exemplary embodiment.

Additionally or alternatively, as shown in FIG. 8, a plurality of coupling holes 213f may be formed in a first coupling bracket 213-2 and a second coupling bracket 223-2, respectively, and a plurality of fastening members (e.g. screws) S may be passed through the coupling holes 213f and threadably coupled with the 14 coupling holes 223f, thereby coupling the first coupling bracket 213-2 with the second coupling bracket 223-2.

Also, in the present exemplary embodiment, the first coupling portion 215 and the second coupling portion 225 may respectively consist of two configurations (that is, the coupling covers 212 and 222 and the coupling brackets 213 and 223), however, the first coupling portion 215 and the second coupling portion 225 may respectively be formed with a single configuration. Also, the first coupling portion 215 may be integrated into (i.e. fabricated integrally with) the first leg portion 211, and the second coupling portion 225 may be integrated into (i.e. fabricated integrally with) the second leg portion 221.

In the present exemplary embodiment, the locking protrusions 214b are spaced at the angle of 55 degrees in the circumferential direction apart from each respective protrusion through hole 223c-2, however, the angle between the locking protrusions 214b and the protrusion through holes 223c-2 may be any angle, and may for example be an angle within a range of 45 degrees to 90 degrees.

As described above, since the display apparatus according to an exemplary embodiment is packed in the state in which the stand is separated into the first stand member and the second stand member in the front-rear direction, it is possible to greatly reduce the size of a packing box for packing the display apparatus.

Also, the display apparatus according to an exemplary embodiment can be completely assembled by coupling the first coupling portion installed in the first stand member with the second coupling portion installed in the second stand member in the front-rear direction, and then inserting the first coupling portion and the second coupling portion into the coupling groove of the display unit. Accordingly, a user can easily couple the stand with the display unit.

Also, since the display apparatus according to an exemplary embodiment can stably maintain the coupled state of the first stand member and the second stand member through the locking member and the locking hole provided in the first coupling bracket and the second coupling bracket, it is possible to omit or minimize various kinds of additional components or members for maintaining the coupled state of the first stand member and the second stand member.

Although a few exemplary embodiments have been shown and described, it would be appreciated by those skilled in the art that changes may be made in these exemplary embodiments without departing from the principles and spirit of the disclosure, the scope of which is defined in the claims and their equivalents.

What is claimed is:

1. A display apparatus comprising:
   a display unit; and
   a stand configured to support the display unit to stand on a horizontal plane,
   wherein the stand comprises a first stand member and a second stand member coupled with each other in a front-rear direction,
   the first stand member comprises a first coupling bracket installed in a rear center portion of the first stand member, and
   the second stand member comprises a second coupling bracket installed in a front center portion of the second stand member.

2. The display apparatus according to claim 1, wherein the first stand member further comprises a first coupling portion extending upward,
   the second stand member further comprises a second coupling portion extending upward,
   the first coupling portion and the second coupling portion are coupled together to form a coupling portion, and
   the display unit comprises a coupling groove coupled with the coupling portion.

3. The display apparatus according to claim 2, wherein the first stand member further comprises a first leg portion supported on the horizontal plane, and
   the second stand member further comprises a second leg portion supported on the horizontal plane.

4. The display apparatus according to claim 3, wherein the first coupling portion comprises the first coupling bracket installed in a rear center portion of the first leg portion, and
   the second coupling portion comprises the second coupling bracket installed in a front center portion of the second leg portion.

5. The display apparatus according to claim 4, further comprising:
   a locking member disposed in one of the first coupling bracket and the second coupling bracket, and
   a locking hole formed in the other one of the first coupling bracket and the second coupling bracket,
   wherein the locking member passes through and is locked within the locking hole.

6. The display apparatus according to claim 5, wherein the locking member comprises a shaft portion protruding in a shape of a cylinder, and at least one locking protrusion protruding in a radial direction from a top end of the shaft portion, and the locking hole comprises a shaft through hole to pass the shaft portion through, and at least one protrusion through hole extending in a radial direction from the shaft through hole, and spaced in a circumferential direction apart from the at least one locking protrusion with the locking member locked within the locking hole.

7. The display apparatus according to claim 6, further comprising:
   a stopper protrusion protruding from one of the first coupling bracket and the second coupling bracket, and
   a stopper groove formed in the other one of the first coupling bracket and the second coupling bracket, and configured to support the stopper protrusion.

8. The display apparatus according to claim 4, wherein the first coupling bracket and the second coupling bracket are disposed to correspond to each other, and comprise at least one first coupling hole and at least one second coupling hole, respectively, which are coupled with a fastening member.

9. The display apparatus according to claim 4, further comprising at least one support protrusion protruding from one of the first coupling bracket and the second coupling bracket,
wherein at least one support hole is formed in the other one of the first coupling bracket and the second coupling bracket so that the at least one support protrusion is inserted into and supported by the at least one support hole.

10. The display apparatus according to claim 3, wherein the first leg portion extends toward both directions with a predetermined angle with respect to a front direction to form a V-shape, and the second leg portion extends toward both directions with a predetermined angle with respect to a rear direction to form a V-shape.

11. The display apparatus according to claim 5, wherein the locking member is fixed at a hole formed in the one of the first coupling bracket and the second coupling bracket.

12. A display apparatus comprising:
a display unit; and
a stand configured to support the display unit to stand on a horizontal plane,
wherein the stand comprises:
a first stand member and a second stand member coupled with each other in a front-rear direction,
a locking member disposed in one of the first stand member and the second stand member, and
a locking hole formed in the other one of the first stand member and the second stand member, wherein the locking member passes through and is locked within the locking hole,
wherein the locking member comprises:
a shaft portion protruding in a shape of a cylinder, and
at least one locking protrusion protruding in a radial direction, and
wherein the locking hole comprises:
a shaft through hole to pass the shaft portion through, and
at least one protrusion through hole extending in a radial direction from the shaft through hole, and spaced in a circumferential direction apart from the at least one locking protrusion with the locking member locked within the locking hole.

13. The display apparatus according to claim 12, wherein the at least one locking protrusion protrudes in the radial direction from a top end of the shaft portion.

14. The display apparatus according to claim 13, further comprising:
a stopper protrusion protruding from one of the first stand member and the second stand member, and
a stopper groove formed in the other one of the first stand member and the second stand member, and configured to support the stopper protrusion.

15. The display apparatus according to claim 12, wherein the locking member is locked within the locking hole by rotation of the one of the first stand member and the second stand member relative to the other one of the first stand member and the second stand member.

\* \* \* \* \*